(12) United States Patent
Pouget et al.

(10) Patent No.: US 9,854,675 B2
(45) Date of Patent: Dec. 26, 2017

(54) ELECTRONIC CIRCUIT LAID FLAT AND CORRESPONDING THREE-DIMENSIONAL ELECTRONIC CIRCUIT

(71) Applicant: ZODIAC AERO ELECfRIC, Montreuil (FR)

(72) Inventors: Vianney Pouget, Vincennes (FR); Antonio Simao, Villeneuve la Garenne (FR)

(73) Assignee: Zodiac Aero Electric, Montreuil (FR)

( * ) Notice: Subject to any disclaimer, the term of this patent is extended or adjusted under 35 U.S.C. 154(b) by 117 days.

(21) Appl. No.: 14/539,035

(22) Filed: Nov. 12, 2014

(65) Prior Publication Data

US 2015/0156879 A1 Jun. 4, 2015

(30) Foreign Application Priority Data

Nov. 15, 2013 (FR) ..................... 13 61164

(51) Int. Cl.
| | |
|---|---|
| *H05K 1/00* | (2006.01) |
| *H05K 1/14* | (2006.01) |
| *H05K 1/02* | (2006.01) |
| *H05K 1/11* | (2006.01) |
| *H05K 1/18* | (2006.01) |
| *H05K 3/36* | (2006.01) |

(52) U.S. Cl.
CPC ............ *H05K 1/148* (2013.01); *H05K 1/028* (2013.01); *H05K 1/11* (2013.01); *H05K 1/189* (2013.01); *H05K 3/361* (2013.01); *H05K 2201/047* (2013.01); *H05K 2201/05* (2013.01); *H05K 2201/058* (2013.01); *H05K 2201/10106* (2013.01); *H05K 2201/10151* (2013.01)

(58) Field of Classification Search
CPC .......... H05K 1/028; H05K 1/11; H05K 1/148; H05K 1/147; H05K 2201/058; H05K 1/0278
See application file for complete search history.

(56) References Cited

U.S. PATENT DOCUMENTS

| 3,808,505 | A | * | 4/1974 | Reimer | .................. | H05K 1/117 |
|---|---|---|---|---|---|---|
| | | | | | | 174/254 |
| 5,224,023 | A | * | 6/1993 | Smith | ..................... | G06F 1/184 |
| | | | | | | 174/254 |
| 5,529,502 | A | | 6/1996 | Peltier et al. | | |
| 5,742,484 | A | * | 4/1998 | Gillette | .................. | H05K 1/148 |
| | | | | | | 174/106 R |
| 6,139,360 | A | * | 10/2000 | Hayashi | ................. | H05K 1/148 |
| | | | | | | 439/502 |

(Continued)

OTHER PUBLICATIONS

"Integrated Circuit Package" IBM technical Disclosure Bulletin, IBM Corp. vol. 31, No. 9, 1989.
French Search Report for FR 1361164 dated Sep. 2, 2014.

*Primary Examiner* — Steven T Sawyer
(74) *Attorney, Agent, or Firm* — Meyertons, Hood, Kivlin, Kowert & Goetzel, P.C.; Mark R. DeLuca

(57) ABSTRACT

This electronic circuit, includes a set of electronic boards intended to support components and linked together by joining elements. The joining elements include curved flexible printed circuits linking two opposing ends of two electronic boards running side by side, the said curved flexible printed circuits being foldable for erecting the electronic circuit into a volume so that the electronic circuit comprises electronic boards placed opposite one another.

9 Claims, 3 Drawing Sheets

(56) References Cited

U.S. PATENT DOCUMENTS

| | | | |
|---|---|---|---|
| 2003/0058602 A1* | 3/2003 | Veil | H01H 47/005 361/166 |
| 2010/0103649 A1* | 4/2010 | Hamada | H01R 23/667 362/97.1 |
| 2010/0177018 A1* | 7/2010 | Wang | G06F 1/1601 345/1.3 |
| 2013/0258575 A1 | 10/2013 | Rothkopf et al. | |
| 2014/0061468 A1* | 3/2014 | Nakamura | G01J 5/0215 250/338.1 |

* cited by examiner

ELECTRONIC CIRCUIT LAID FLAT AND CORRESPONDING THREE-DIMENSIONAL ELECTRONIC CIRCUIT

This application claims priority to French Patent Application Serial No. FR 1361164 filed Nov. 15, 2013, which is incorporated herein by reference in its entirety.

BACKGROUND OF THE INVENTION

1. Field of the Invention

The invention relates, generally, to the production of electronic circuits on the basis of electronic boards and, more particularly, to the production of three-dimensional electronic circuits with a view in particular to their integration into a touchscreen.

2. Description of the Relevant Art

Within the framework of the present description, three-dimensional electronic circuit is intended to mean a circuit that includes portions running in a plane different from the general plane of the circuit so as to locally orient the components carried by the circuit.

This may entail, in a mode of implementation, placing portions of the circuit opposite one another so as to place opposite one another components which operate jointly, for example light-emitting diodes and corresponding receivers.

An electronic board, or PCB, standing for "Printed Circuit Board", is a support, in general a plate, making it possible to hold and to link electrically a set of electronic components, with the aim of producing a complex electronic circuit.

Electronic boards can be produced on several types of supports, among which are:
  rigid supports, for example, "epoxy supports", and
  flexible supports, allowing the production of flexible printed circuits.

In all cases, these supports are generally produced from a multilayer material and allow the soldering of components and connectors.

Document US 2013/258 575 describes in this regard an electronic apparatus comprising an electronic circuit produced by uniting two plane electronic boards by means of a flexible connector circuit. The flexible circuit is intended to be bent to give the electronic circuit a three-dimensional shape.

Reference may also be made to document U.S. Pat. No. 5,529,502 which describes an element for assembly and connection between a rigid electronic board and a flexible printed circuit. Such an element makes it possible to produce three-dimensional electronic circuits.

Thus, by end-to-end assembly of rigid electronic boards by means of flexible printed circuits, it is possible to produce a three-dimensional electronic circuit that includes rigid electronic boards exhibiting opposing faces.

It has however been found that the current processes for fabricating three-dimensional circuits impose a certain number of constraints.

Firstly, the electronic boards can only be fabricated flat.

Secondly, the positioning and the soldering of the electronic components and of assembly elements on a board can only be carried out flat.

Consequently, the fabrication of the electronic boards makes it necessary to place the electronic components and the assembly and connection elements flat on a circuit blank.

As will be detailed subsequently with reference to FIGS. 1A and 1B, a known technique thus consists in fabricating a PCB circuit board furnished with fold zones, such as is represented in FIG. 1A, and to join an end connector to obtain the three-dimensional circuit illustrated in FIG. 1B. As is appreciated, the use of such a connector and its joining to the PCB circuit complicates the production of the circuit.

SUMMARY OF THE INVENTION

In view of the foregoing, an electronic circuit is proposed that can be entirely produced flat and that can be erected into a volume without using any connector to ensure the closing of the circuit erected into a volume.

One embodiment is therefore directed to an electronic circuit including a set of electronic boards intended to support components and linked together by joining elements, in which the joining elements include curved flexible printed circuits linking two opposing ends of two electronic boards running side by side, the said curved flexible printed circuits being foldable for erecting the electronic circuit into a volume so that the electronic circuit includes electronic boards placed opposite one another.

According to another embodiment, the electronic circuit includes two rectilinear branches linked by their ends by two curved flexible printed circuits, each including electronic boards linked by a straight flexible printed circuit.

According to another embodiment, the said curved flexible printed circuits are foldable along fold lines running at 45° with respect to the rectilinear branches.

In one embodiment, the curved flexible printed circuits include a first part joined to one of the two electronic boards bound to the flexible circuit, a second part joined to the other electronic board and a middle part situated between the first part and the second part and intended to define with the first part a first fold line and with the second part a second fold line.

By virtue of the cutting of the curved printed circuit into three zones delimited by fold lines, it is possible to produce entirely a three-dimensional circuit, initially flat, and then to fold it, without performing any additional soldering or adding an assembly and connection element.

Provision may be made for the first part and the second part of each curved flexible printed circuit to have the same shape and the same dimensions, the fold lines delimiting a rectangular zone intended to be joined by one of its sides to an electronic board, and a pentagonal zone that includes a first side common to the large side of the rectangular part, a second side orthogonal to the first, a third side, a fourth side joined to the middle part and orthogonal to the third, and a fifth side parallel to the third.

For example, the middle part is a hexagon including a first side common to the fourth side of the pentagon-shaped part of the first part, a second side, a third side common to the fourth side of the pentagon-shaped part of the second part, a fourth side, a fifth side parallel to the second side and a sixth side.

Moreover electronic components are soldered on one of the faces of the electronic circuit.

An embodiment is directed to a three-dimensional electronic circuit that includes a set of electronic boards intended to support components and linked together by joining elements.

The joining elements include folded curved flexible printed circuits linking two opposing ends of two electronic boards side by side so that the electronic circuit includes electronic boards placed opposite one another.

In a mode of implementation, the components supported by the electronic boards include infrared sensors and light-emitting diodes.

Such a circuit can be intended to be integrated into a rectangular frame intended to be incorporated into a touchscreen.

BRIEF DESCRIPTION OF THE DRAWINGS

Other aims, characteristics and advantages of the invention will become apparent on reading the following description, given solely by way of nonlimiting example and with reference to the appended drawings in which.

Figure 1A:
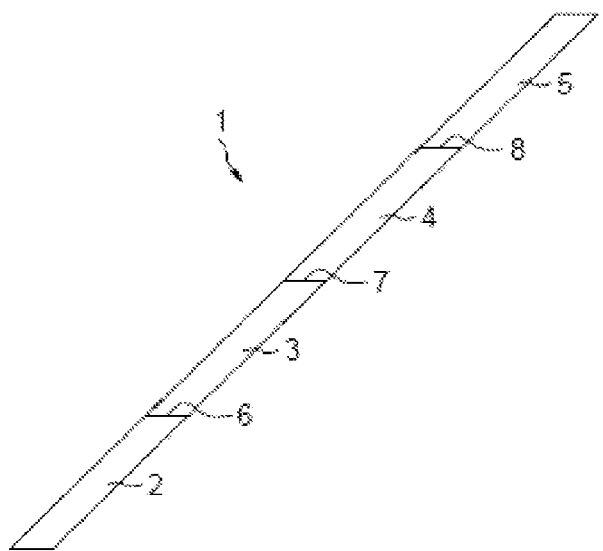
FIG. 1A, mention of which has already been made, represents an electronic circuit blank according to the prior art for the production of a three-dimensional circuit.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

Figure 1B:
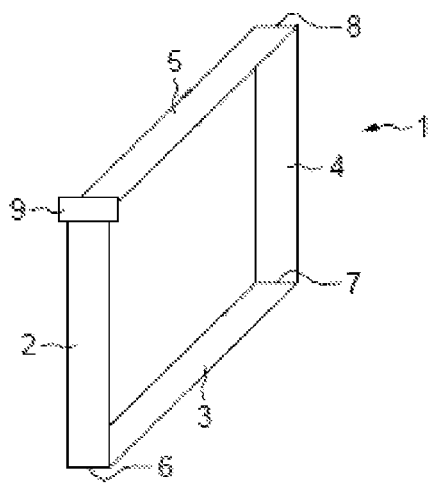
FIG. 1B represents a three-dimensional electronic circuit obtained by means of the blank of FIG. 1A.

Reference will be made firstly to FIGS. 1A and 1B which illustrate respectively an electronic circuit blank and a three-dimensional electronic circuit according to the prior art.

As indicated previously, the electronic circuit blank visible in FIG. 1A is produced on the basis of a PCB circuit board furnished with fold zones on which a set of electronic components are mounted flat.

The PCB circuit board is in reality formed by the assembly of four rigid electronic boards 2, 3, 4 and 5 bound together by three flexible zones 6, 7 and 8 produced on the basis of a flexible printed circuit.

The circuit blank 1 is produced totally flat. It is therefore possible to solder the electronic components on either side of the electronic boards.

In this example, the electronic boards 2 and 4 measure one and the same first length while the boards 3 and 5 measure one and the same second length. By means of the flexible zones, it is possible to fold down the flexible boards so that the electronic circuit 1 adopts a rectangle shape, as seen in FIG. 1B.

In this position, an end of the board 2 lies opposite an end of the board 5, a connector 9 including a flexible printed circuit making it possible to close the circuit so as to obtain the three-dimensional circuit of FIG. 1B.

As indicated previously, the production of such a three-dimensional electronic circuit makes it necessary to use a connector to ensure the electrical joining and the mechanical fixing of the free ends of the two end electronic boards 2 and 5.

Figure 2:
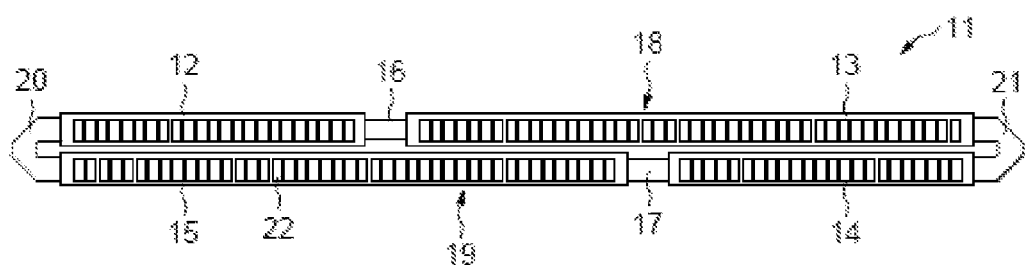
FIG. 2 represents an electronic circuit intended for the flat production of an electronic circuit.

An electronic circuit laid flat makes it possible to alleviate this drawback has been represented in FIG. 2.

As seen, the electronic circuit laid flat, designated by the general numerical reference 11, includes a first electronic board 12, a second board 13, a third board 14 and a fourth board 15. The boards 13 and 15 measure one and the same first length, while the boards 12 and 14 measure one and the same second length. As will be described in detail subsequently, such dimensions are intended to obtain a generally rectangular three-dimensional electronic circuit. Of course, one does not depart from the scope of the invention if the electronic boards all have the same length so as to obtain a three-dimensional electronic circuit of square shape.

In this example, the width of the four electronic boards is constant and equal to 7.5 mm. This width corresponds to the thickness of the circuit erected into a volume.

The first and second electronic boards 12 and 13 are joined by a first straight flexible printed circuit 16. Likewise, the third and fourth boards 14 and 15 are linked by a second straight flexible printed circuit 17. The two straight flexible circuits are of the same length. These flexible circuits 16 and 17 can be curved according to a continuous curvature around an axis of curvature running in the plane of FIG. 2, that is to say in the plane of the flat circuit. The circuit therefore includes a first linear branch 18, including the first and second boards 12, 13 and the straight flexible circuit 16, and a second linear branch 19 including the boards 14 and 15 and the straight flexible circuit 17. The linear parts 18 and 19 are of the same length.

The circuit 11 also includes two curved flexible printed circuits 20 and 21 ensuring the inter-joining of the linear branches 18 and 19. These circuits, in contradistinction to the straight flexible circuits, are intended to be folded around fold lines. A first curved flexible circuit 20 is disposed so that its ends are bound respectively to the first and fourth boards 12 and 15. A second curved flexible circuit 21 is disposed so that its ends are bound respectively to the second and third boards 13 and 14.

Viewed from above the curved flexible circuits have a U shape and include two end tabs directed in the same direction, thereby making it possible to perform all the soldering necessary for their joining to the boards even when the circuit is flat, so that the linear branches 18 and 19 run parallel to one another.

Figure 3:
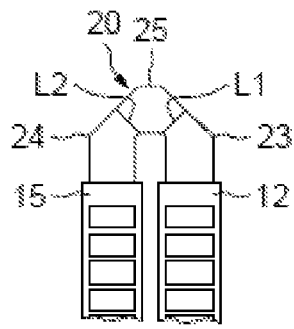
FIG. 3 is a detail view of the circuit of FIG. 2, FIGS. 4 and 5 schematically represent detail views of the foldable curved flexible printed circuits of the circuit of FIG. 2, FIGS. 6A and 6B are end-on and plan views of the joining elements, in the folded state.

The curved flexible circuits include two oblique fold lines L1 and L2 (FIG. 3). These fold lines form between them an angle of 90° and each run at an angle of 45° with respect to the axis of the linear branches. Of course, such fold lines can be dummy and be formed only during the folding of the foldable flexible zones.

It will be however noted that the folding is performed by displacing the branches 18 and 19 around the fold lines L1 and L2 in opposite directions of rotation. Stated otherwise, whereas during folding one of the rectilinear branches is applied against one of the faces of the curved flexible circuits, the other branch is applied against the opposite face of these curved flexible circuits. As will be described in detail subsequently, after folding, the curved flexible circuits are furthermore intended to be bent to form the three-dimensional electronic circuit.

In this example, once the circuit has been erected into a volume, the length of all the flexible circuits is 10 mm, whether they be the straight flexible circuits or the folded curved flexible circuits.

As shown by FIG. 3, each curved flexible printed circuit 20 and 21 includes a first part 23 joined to the end board of one of the branches, a second part 24 joined to the end board of the other branch, and a middle part 25 disposed between the first and second joining portions.

The first and second parts 23 and 24 therefore run in the extension of the end board to which they are joined. They include a rectangular zone 26 extended by a pentagonal zone 27.

Figure 4:
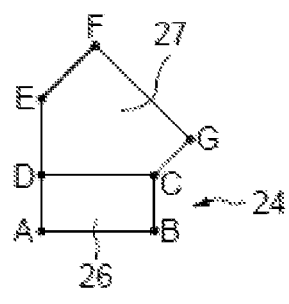
Figure 5:
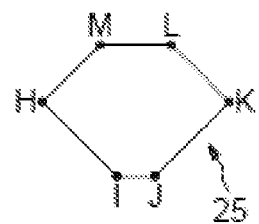

It will be noted that the shape visible in FIGS. 3, 4 and 5 is the base shape of the curved flexible circuit. In particular, the latter can include fillets at the level of the corners on its interior part or roundings at the level of the corners on its exterior part.

Moreover, the dimensions stated in the examination of FIGS. 3, 4 and 5 are given by way of nonlimiting example. These dimensions are compatible with a width of the electronic boards of 7.5 mm and a length of flexible circuit linking two electronic boards of 10 mm. Of course, by multiplying all the dimensions by one and the same proportionality coefficient, it is possible to preserve this complementarity for different dimensions.

As visible in FIG. 4, which shows the second part 24, the rectangular zone 26 designated by the rectangle ABCD is bound by a first large side AB to the electronic board 15. This bond can be implemented by soldering. In this example, the small side BC measures for example 5.80 mm and the large side AB measures 6.50 mm.

The pentagonal zone 27, designated by the pentagon CDEFG, includes a first side CD common with the large side of the rectangular zone 26, a second side DE orthogonal to the first side, a third side EF, a fourth side FG joined to the middle part and orthogonal to the third side EF, and a fifth side GC parallel to the third side EF. In this example, the distance between the straight line (DE) and the vertex F equals 3.45 mm. The distance between the straight line (DE) and the vertex G equals 7 mm. The length of the first side CD remains equal to the length of the large side of the rectangular part 26. The length of the fourth side FG equals 4.97 mm.

It will be noted that the figure admits an axis of symmetry, so that the first part 23 has exactly the same shape and the same dimensions as the second part 24, to within an axial symmetry.

As visible in FIG. 5, the middle zone 25 unites the first and second parts 23 and 24 of the flexible circuits. Viewed from above, it has the shape of a hexagon HIJKLM. The side HI is joined to the second part 24. More precisely, the points H and I coincide respectively with the points F and G of the second part 24. The side JK is joined in the same manner to the first part 23. The sides HI and JK are consequently of the same length as the side to which they are linked, namely 4.97 mm. The side LM is parallel to the side IJ. The length of the side LM equals 2.66 mm. The distance between the parallel sides IJ and LM is 7 mm. Finally the distance HK is 9.65 mm.

Of course, the dimensions indicated within the framework of the present description are purely indicative and one does not depart from the scope of the invention if the flexible circuits adopt other dimensions.

The sides HI and JK constitute the fold lines of the curved flexible circuit 20. In the folded state, the first and second parts 23 and 24 are rotated 180°, around the fold lines HI and JK, each in opposite directions of rotation. After folding, the parts 23 and 24 run along the same axis, in opposite directions, as seen in FIG. 6A.

Figure 6A:
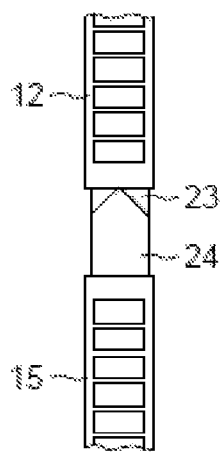
Figure 6B:
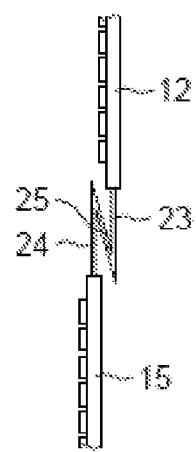

FIGS. 6A and 6B respectively represent end-on and plan views of the electronic boards 12 and 15 linked by the curved flexible circuit 20. Moreover, the loads necessary to have a circuit in the folded, but not bent, state have been applied. The boards 12 and 15 consequently run along the same axis and in opposite directions. The two parts 23 and 24 of the circuit 20 are seen in FIGS. 6A and 6B. The middle part 25 is visible only in FIG. 6B.

As indicated previously, the middle part 25 of the curved flexible circuit 20 is furnished with a truncated end tip. Thus, after folding, no portion of the curved flexible circuit 20 projects. It is seen in particular in FIG. 6A that the end side of the curved flexible circuit 20 is in reality flush with one of the sides of the folded curved flexible circuit.

Figure 7:
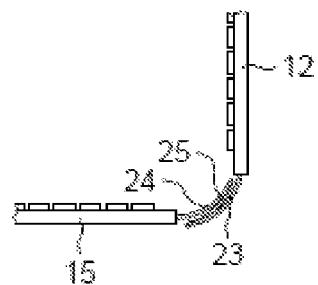
FIG. 7 represents a folded and bent joining element.

Once the circuit 20 has been folded, it can be bent so as to render the planes of the electronic boards 12 and 15 perpendicular. A view from above of such a disposition is visible in FIG. 7.

Figure 8:
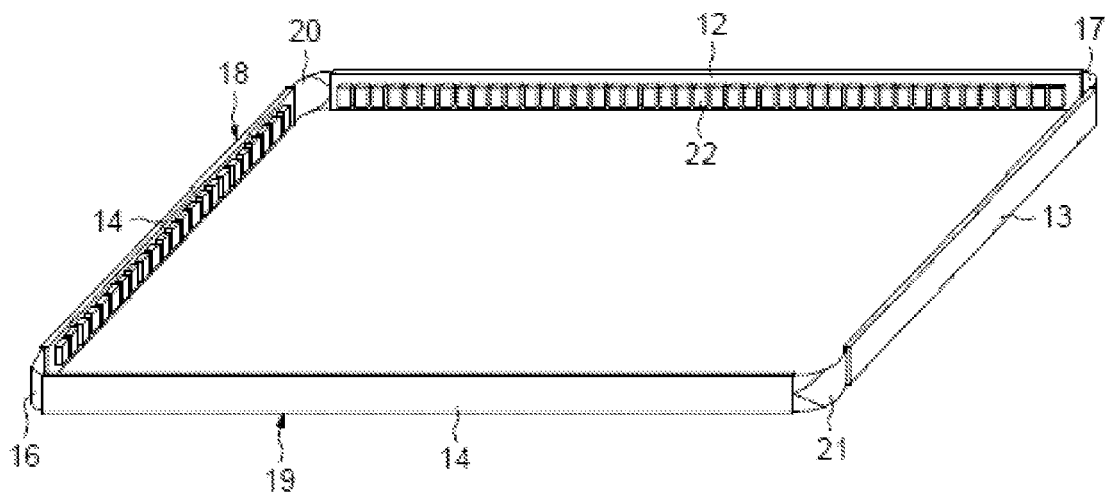
FIG. 8 represents a three-dimensional electronic circuit obtained by means of the circuit of FIG. 2, erected into a volume.

FIG. 8 represents a perspective view of the three-dimensional electronic circuit obtained on the basis of the flat circuit 11 of FIG. 2, which includes the two branches 18 and 19 that includes the electronic boards 12, 13, 14 and 15 and of the straight flexible electronic circuits 16 and 17, and bound together by the two curved flexible electronic circuits 20 and 21. FIG. 8 represents the circuit in the folded and bent state, so that the electronic boards are oriented in four different planes. The electronic boards are moreover opposite one another.

In view of the foregoing, the production of a three-dimensional electronic circuit can be implemented in the following manner The electronic boards are firstly produced and the electronic boards and the flexible circuits are assembled. The electronic components are thereafter mounted on connection sites provided on the electronic boards, and then the curved flexible circuits are folded along the fold lines and the flexible circuits are bent.

The three-dimensional circuit visible in FIG. 8 is then obtained.

As appreciated, by virtue of the use of the curved flexible circuits placed between the electronic boards, it is possible to produce a three-dimensional electronic circuit using conventional fabrication techniques, in which the components are mounted flat on a circuit, doing so without having to disconnect one of the bonds between the electronic boards and the flexible circuits.

It will be noted finally that the embodiments of a three-dimensional electronic circuit, described herein, finds a particularly beneficial application in respect of the production of three-dimensional electronic circuits intended to be incorporated into a touchpad of infrared type and, more particularly, to render a viewing screen touch-sensitive.

In this case, referring to FIGS. 2 and 8, the electronic boards 12, 13, 14 and 15 receive an array of electronic components 22 comprising corresponding detectors and infrared diodes.

More particularly, of the electronic boards intended to be positioned opposite one another, such as the boards referenced 13 and 15, on the one hand and 12 and 14, on the other hand, one includes an array of infrared diodes and the other an array of corresponding detectors.

Such a three-dimensional electronic circuit can advantageously be disposed in a frame which is mounted around the screen.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A flat electronic circuit, comprising a set of electronic boards intended to support components and linked together by joining elements, wherein the joining elements comprise curved flexible printed circuits linking two ends of two electronic boards of the set of electronic boards, the two electronic boards being arranged side by side, wherein the flat electronic circuit comprises two parallel rectilinear branches linked together by their ends by two curved flexible printed circuits so as to form a closed flat electronic circuit and each parallel rectilinear branch comprises electronic boards linked by a straight flexible printed circuit, the said curved flexible printed circuits being foldable and the straight flexible printed circuits being bendable for erecting the flat electronic circuit into a three-dimensional electronic circuit comprising electronic boards placed opposite one another; wherein said curved flexible printed circuits are foldable along fold lines running at 45° with respect to the rectilinear branches.

2. The electronic circuit according to claim 1, wherein the curved flexible printed circuits comprise a first part joined to one of the two electronic boards bound to the flexible circuit, a second part joined to the other electronic board and a middle part situated between the first part and the second part and intended to define with the first part a first fold line and with the second part a second fold line.

3. The electronic circuit according to claim 2, wherein the first part and the second part of each curved flexible printed circuit have the same shape and the same dimensions, the fold lines delimiting a rectangular zone intended to be joined by one of its sides to an electronic board, and a pentagonal zone comprising a first side common to the large side of the rectangular zone, a second side orthogonal to the first, a third side, a fourth side joined to the middle part and orthogonal to the third, and a fifth side parallel to the third.

4. The electronic circuit according to claim 2, in which the middle part is a hexagon, comprising a first side common to the fourth side of the pentagon-shaped part of the first part, a second side, a third side common to the fourth side of the pentagon-shaped part of the second part, a fourth side, a fifth side parallel to the second side and a sixth side.

5. The electronic circuit according to claim 1, wherein electronic components are soldered on one of the faces of the electronic circuit.

6. A three-dimensional electronic circuit obtained on the basis of a flat electronic circuit comprising a set of electronic boards intended to support components and linked together by joining elements, wherein the joining elements comprise folded curved flexible printed circuits linking two ends of two electronic boards side by side so that the electronic circuit comprises electronic boards placed opposite one another, wherein the flat electronic circuit comprises two parallel rectilinear branches linked together by their ends by two curved flexible printed circuits so as to form a closed flat electronic circuit and each parallel rectilinear branches comprising electronic boards linked by a straight flexible printed circuit, and wherein said three-dimensional electronic circuit being formed by folding the curved flexible printed circuits and bending the straight flexible printed circuits, so that the electronic boards of the three-dimensional electronic circuit are oriented in four different planes; wherein said curved flexible printed circuits are foldable along fold lines running at 45° with respect to the rectilinear branches.

7. The three-dimensional electronic circuit according to claim 6, wherein the components supported by the electronic boards comprise infrared sensors and light-emitting diodes.

8. The three-dimensional electronic circuit according to claim 6, wherein the three-dimensional electronic circuit is intended to be integrated into a rectangular frame intended to be incorporated into a touchscreen.

9. The electronic circuit according to claim 1, wherein the two parallel rectilinear branches comprise: a first rectilinear branch that comprises a first and a second electronic board linked together by a first straight flexible printed circuit; and a second rectilinear branch that comprises a third and a fourth electronic board linked together by a second straight flexible printed circuit and wherein a first curved flexible circuit is arranged so that its ends bound respectively to the first and fourth electronic boards and a second curved flexible circuit is arranged so that its ends bound respectively to the second and third electronic board.

* * * * *